United States Patent
Khudorozhkov et al.

(10) Patent No.: US 10,846,445 B2
(45) Date of Patent: Nov. 24, 2020

(54) METHOD OF WASTE DISTRIBUTION AND FORMATION PRESSURE PROFILE DETERMINATION

(71) Applicant: M-I L.L.C., Houston, TX (US)

(72) Inventors: Pavel Khudorozhkov, Krasnoyarsk (RU); Talgat Shokanov, Almaty (KZ); Viacheslav Viktorovich Anokhin, Houston, TX (US); Salamat Gumarov, Abu Dhabi (AE); Gustavo Villarroel, Houston, TX (US)

(73) Assignee: M-I L.L.C., Houston, TX (US)

( * ) Notice: Subject to any disclaimer, the term of this patent is extended or adjusted under 35 U.S.C. 154(b) by 409 days.

(21) Appl. No.: 15/735,936

(22) PCT Filed: Jun. 20, 2016

(86) PCT No.: PCT/US2016/038303
§ 371 (c)(1),
(2) Date: Dec. 12, 2017

(87) PCT Pub. No.: WO2016/205774
PCT Pub. Date: Dec. 22, 2016

(65) Prior Publication Data
US 2018/0181692 A1  Jun. 28, 2018

Related U.S. Application Data

(60) Provisional application No. 62/181,492, filed on Jun. 18, 2015.

(51) Int. Cl.
*G06F 30/20* (2020.01)
*E21B 41/00* (2006.01)
(Continued)

(52) U.S. Cl.
CPC .............. *G06F 30/20* (2020.01); *E21B 21/00* (2013.01); *E21B 41/0057* (2013.01);
(Continued)

(58) Field of Classification Search
CPC ...... G06F 30/20; G06F 30/23; E21B 41/0092; E21B 41/0057; E21B 49/00; E21B 49/02; E21B 21/00; E21B 47/06; E21B 43/26
See application file for complete search history.

(56) References Cited

U.S. PATENT DOCUMENTS

2009/0248374 A1   10/2009 Huang et al.
2010/0076738 A1*   3/2010 Dean ..................... G06F 17/13
                                                                703/7
(Continued)

FOREIGN PATENT DOCUMENTS

WO        2014/144917 A1    9/2014

OTHER PUBLICATIONS

International Preliminary Report on Patentability for the equivalent International patent application PCT/US2016/038303 dated Dec. 28, 2017.

(Continued)

*Primary Examiner* — Eunhee Kim
(74) *Attorney, Agent, or Firm* — Jeffrey D. Frantz

(57) ABSTRACT

An example modeling process of pore pressure and injected waste distribution profile may include several steps. A hydrodynamic flow simulation model may be built according to the geometry and/or physical properties of the subsurface formation. A fluid distribution and pore pressure profile in the subsurface may be affected by the geometry and orientation of hydraulic fractures created as a result of drill cuttings subsurface injection (cuttings re-injection or CRI). A fracture profile may be generated using a hydraulic fracturing simulation and may then be embedded into the (Continued)

hydrodynamic simulation model. In some examples, the nature of injected fluids in the same formation and through the same well, fracture, and/or perforation interval may lead to modification of the subsurface formation properties, and this may be accounted for in the simulation.

19 Claims, 12 Drawing Sheets

(51) Int. Cl.
    *E21B 49/00*     (2006.01)
    *E21B 49/02*     (2006.01)
    *E21B 21/00*     (2006.01)
    *E21B 47/06*     (2012.01)
    *E21B 43/26*     (2006.01)
    *G06F 30/23*     (2020.01)

(52) U.S. Cl.
    CPC .......... *E21B 41/0092* (2013.01); *E21B 43/26* (2013.01); *E21B 47/06* (2013.01); *E21B 49/00* (2013.01); *E21B 49/02* (2013.01); *G06F 30/23* (2020.01)

(56) References Cited

U.S. PATENT DOCUMENTS

| | | | |
|---|---|---|---|
| 2010/0138202 A1* | 6/2010 | Mallison | E21B 43/00 703/10 |
| 2011/0162849 A1 | 7/2011 | Soliman et al. | |
| 2012/0179379 A1 | 7/2012 | Alshawaf et al. | |
| 2012/0232872 A1* | 9/2012 | Nasreldin | G01V 99/005 703/10 |
| 2014/0151035 A1* | 6/2014 | Cohen | E21B 43/26 166/250.15 |
| 2015/0176400 A1* | 6/2015 | Kulathu | E21B 43/26 703/10 |
| 2016/0209546 A1* | 7/2016 | Ramsay | G05B 17/02 |
| 2016/0370499 A1* | 12/2016 | Berard | G01V 99/005 |

OTHER PUBLICATIONS

International Search Report and Written Opinion for the equivalent International patent application PCT/US2016/038303 dated Oct. 11, 2016.

* cited by examiner

Fracture Porosity

Fracture Porosity

METHOD OF WASTE DISTRIBUTION AND FORMATION PRESSURE PROFILE DETERMINATION

CROSS-REFERENCE TO RELATED APPLICATION

The present document is based on and claims priority to U.S. Provisional Application Ser. No. 61/181,492, filed Jun. 18, 2015, which is incorporated herein by reference in its entirety.

BACKGROUND

The present disclosure contemplates that, during the well construction process, a wide range of waste including drill cuttings, waste mud, brine, oily drains, pits residuals, and the like is generated. Cuttings re-injection (CRI) generally refers to a process of degrading the solids, mixing the solids into a slurry, and injecting the slurry into a subsurface formation.

The present disclosure further contemplates that solids particles are retained within hydraulic fractures created in the formation by high pressure pumping and the liquid phase of slurry filtrates into the formation.

Conventionally, subsurface containment of the initiated hydraulic fractures is evaluated in the industry by numerical modeling of hydraulic fractures. However, there are no established methods to evaluate the extent of filtrated liquids in the formation and to evaluate the formation pressure increase driven by liquids injected into the formation.

Science-based evaluation of pore pressure increase around the injection point and front of injected liquids invasion can avoid problems while drilling the intervals affected by cuttings injection.

BRIEF DESCRIPTION OF THE DRAWINGS

The foregoing and other features of the present disclosure will become more fully apparent from the following description, taken in conjunction with the accompanying drawings. Understanding that these drawings depict only several embodiments in accordance with the disclosure and are therefore, not to be considered limiting of its scope, the disclosure will be described with additional specificity and detail through use of the accompanying drawings.

In the drawings.

DETAILED DESCRIPTION

Figure 1:
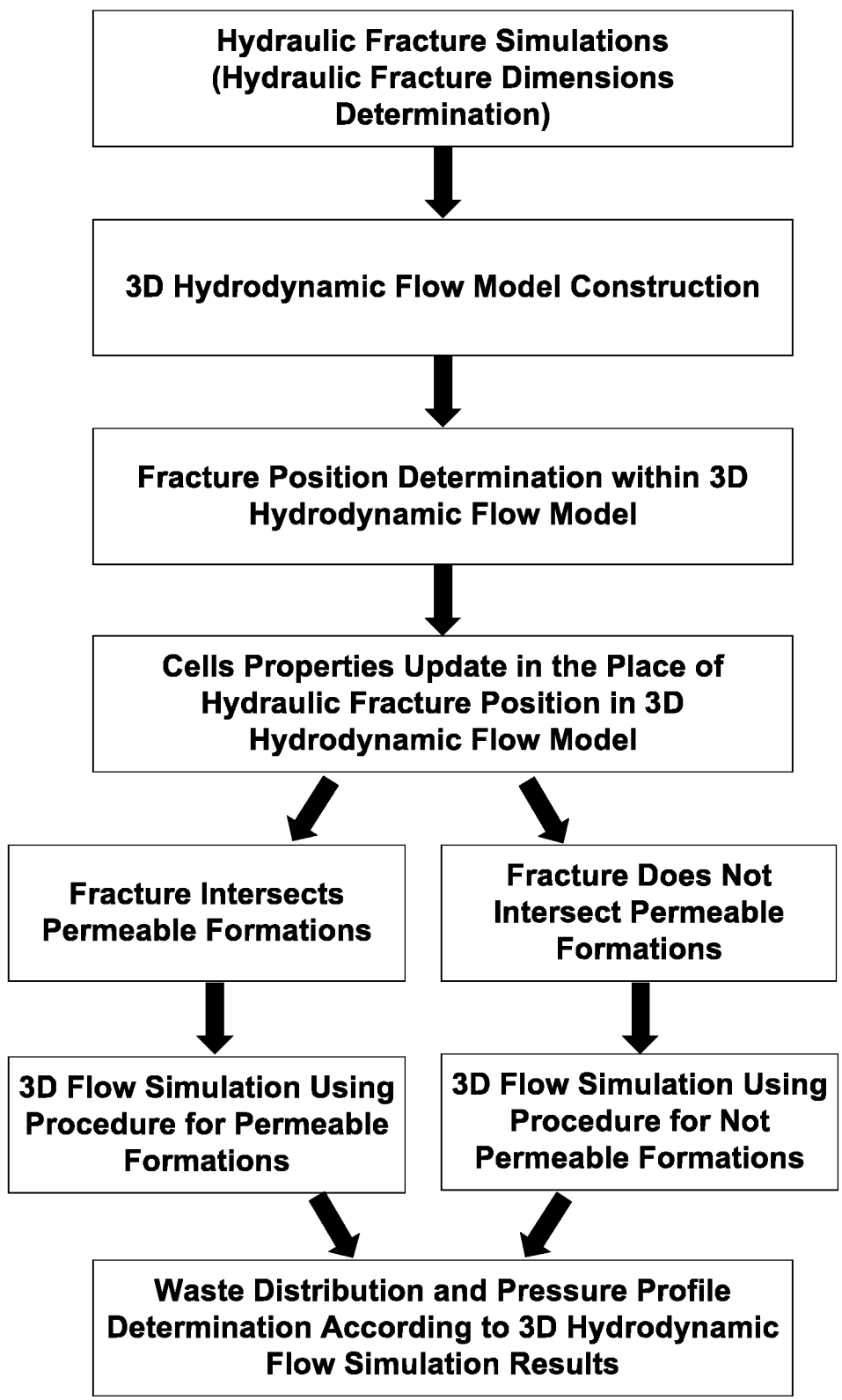
FIG. 1 is a flowchart depicting an example method of waste distribution and formation pressure profile determination.
Figure 2:
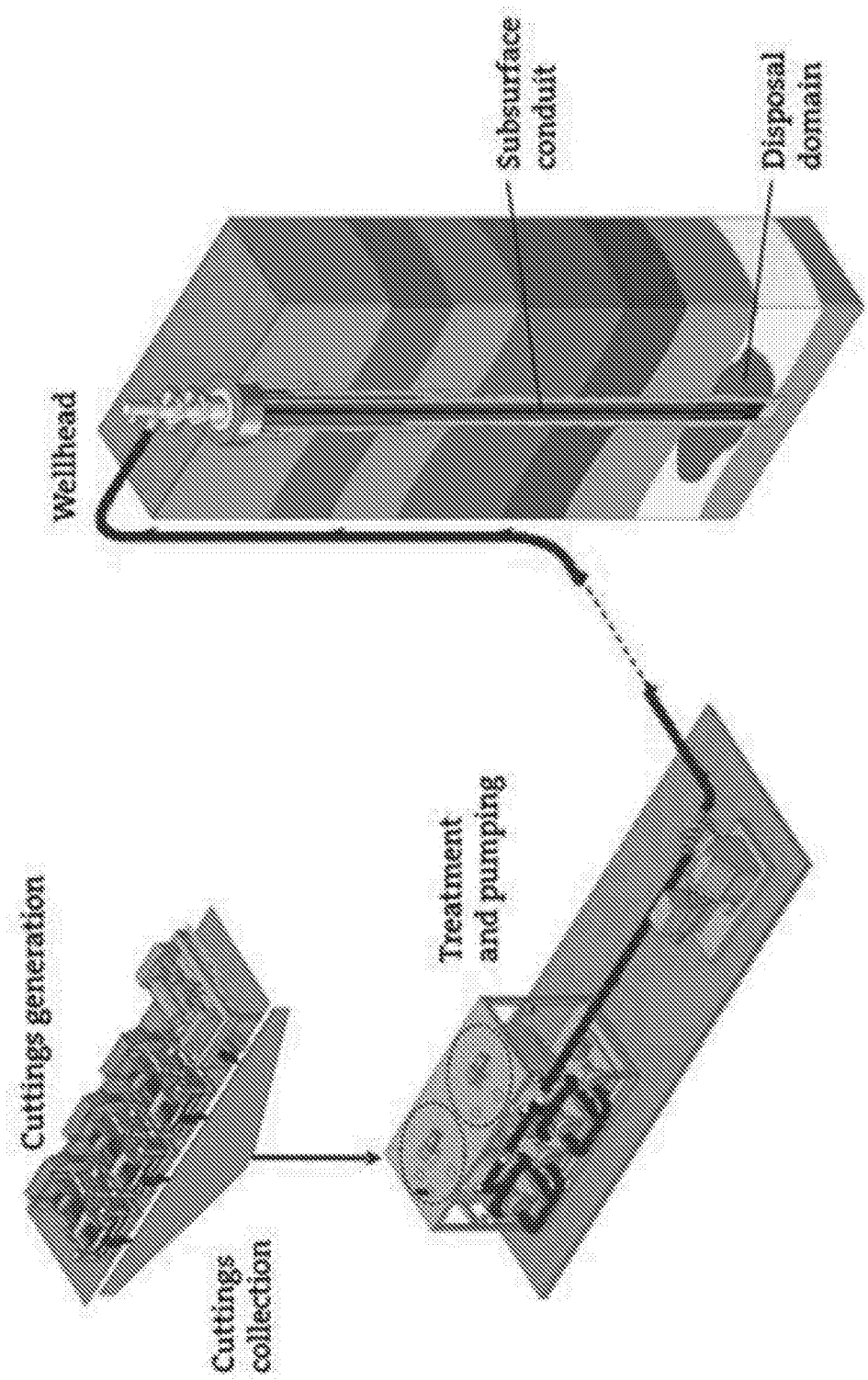
FIG. 2 is an example depiction of an example cuttings re-injection process.

In the following detailed description, reference is made to the accompanying drawings, which form a part hereof. In the drawings, similar symbols typically identify similar components, unless context dictates otherwise. The illustrative embodiments described herein are not meant to be limiting. Other embodiments may be utilized, and other changes may be made, without departing from the spirit or scope of the subject matter presented here. It will be readily understood that the aspects of the present disclosure, as generally described herein, and illustrated in the Figures, may be arranged, substituted, combined, and designed in a wide variety of different configurations, all of which are explicitly contemplated and make part of this disclosure.

An example modeling process of pore pressure and injected waste distribution profile may include several steps. A hydrodynamic flow simulation model may be built according to the geometry and/or physical properties of the subsurface formations. A fluid distribution and pore pressure profile in the subsurface may be affected by the geometry and orientation of the hydraulic fractures created as a result of drill cuttings subsurface injection (cuttings re-injection or CRI). A fracture profile may be generated using hydraulic fracturing simulator and may then be embedded into a hydrodynamic simulation model. In some examples, the nature of injected fluids in the same formation and through the same well, fracture, and perforation interval may lead to modification of the subsurface formation properties, and this may be accounted for in the simulation. Fluid distribution may take place in permeable or impermeable formations. Procedures may be defined for cases of waste accumulation in both permeable and not permeable formations.

Cutting re-injection flow simulation may predict the value of pore pressure and fluids saturation in subsurface formations at a certain distance around the CRI injection well as a result of waste injection. Fluid flow in the porous media of the subsurface may be modeled using a hydrodynamic flow simulator. A flow simulator may provide accurate representations of the formations in the subsurface and may predict the injected fluids distribution and formation pressure response. In some example flow simulators, subsurface formations and layers may be divided into cells (or blocks) in horizontal and/or vertical directions. Each block may be characterized by local reservoir properties which may include porosity, permeability, fluid saturation, pore pressure and/or other properties.

Figure 3:
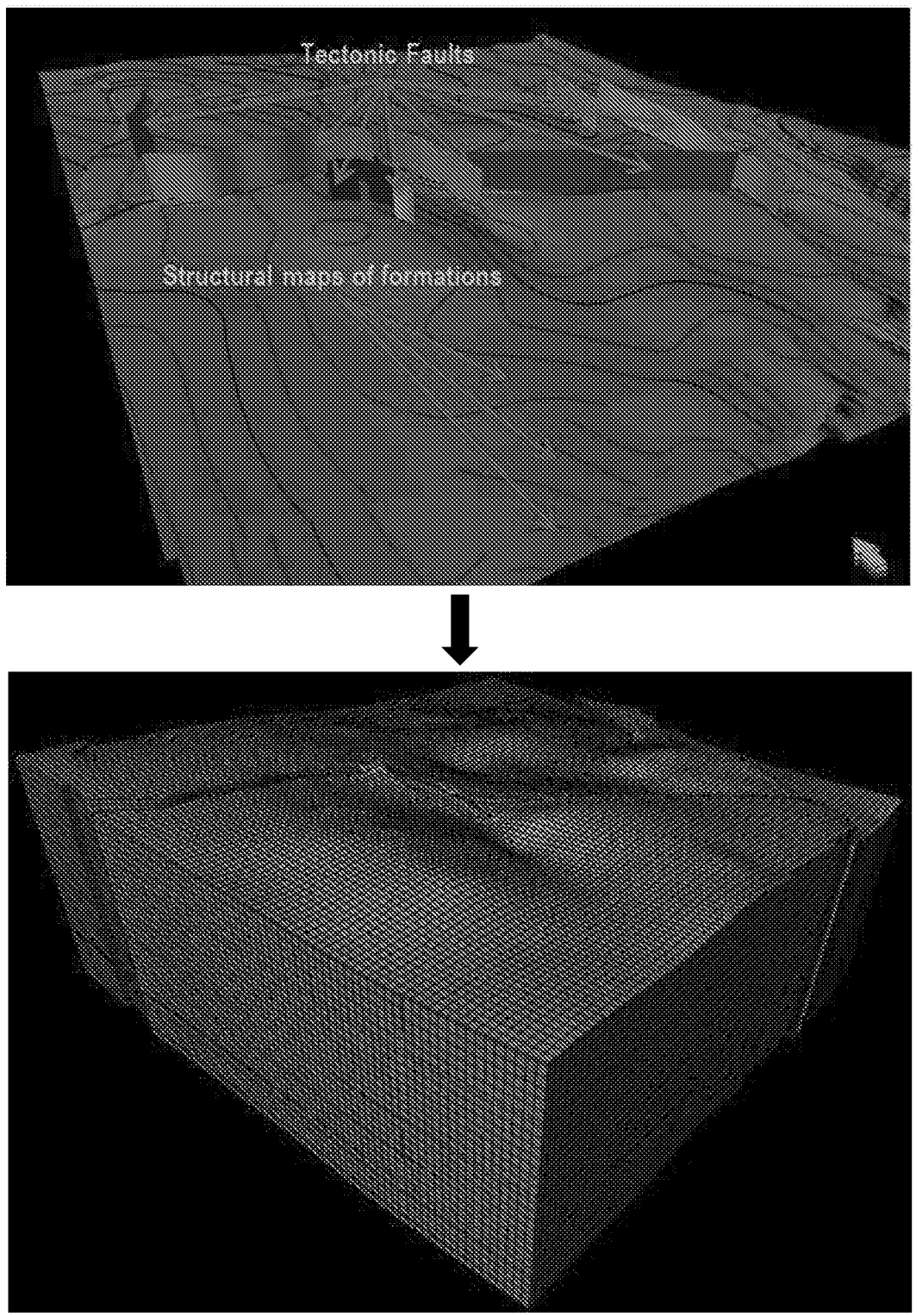
FIG. 3 is an example depiction of an example three-dimensional flow simulation model grid.

A simulation grid of the hydrodynamic model may be composed of cells based on the structural information of the studied formations. Structural maps and fault data may define and control the geometry of the simulation model. Structural maps of geological formations may be constructed based on depth information of formations' tops and bottoms at different parts of the simulated area. Dimensions of the simulation grid may be defined by the number of cells in areal and/or vertical directions. The number of cells may depend on the simulated area, the thickness of the studied cross-section, and dimensions of each cell. Cell dimensions and number of cells in some example models may depend on an operator's requested precision of simulation. A larger number of cells and smaller cell dimensions may provide a more precise model. Each formation may also be divided vertically into layers according to the formation's thickness. An example simulation grid is shown in FIG. 3.

Each cell in the simulation grid may have coordinates according to cell row (i), column (j), and layer (k). Each cell may also be characterized by coordinates in the coordinate system of the studied area. Waste injection may be performed through the injection interval of the injection well. The injection interval may be any open interval inside the well that provides the communication between the well and the subsurface injection zone. In the simulation model, the position of the CRI well may be specified as coordinates of cells (i, j, k) which may be intersected by the well injection interval. The injection interval in the model may be represented by the cells which belong to the fractured domain. To determine such cells, one may construct the relative position of the fracture geometry from the hydraulic fracturing simulator and the simulation model grid. The cells that are intersected by the fracture may represent the fractured domain in the model.

In some examples, the hydrodynamic flow simulator may generate a simulation for double porosity or double permeability systems. In such cases, this may provide a more precise representation of the CRI process in the subsurface.

Double porosity generally means two types of porous space presented in subsurface. The first type of porous space may be defined as the openings between the grains of the rocks. The second type of the porous space is related to the fractures which intersect these rocks. An example double porosity system may be fractured sandstone. The first type of porosity is related to sandstone matrix and the second type of porosity is related to fractures. In some example double porosity systems, flow is not possible between two adjacent matrix blocks. Matrix blocks may communicate only with fractured ones. Double permeability system may be a modified double porosity where the flow is allowed between the matrix blocks.

Figure 4:
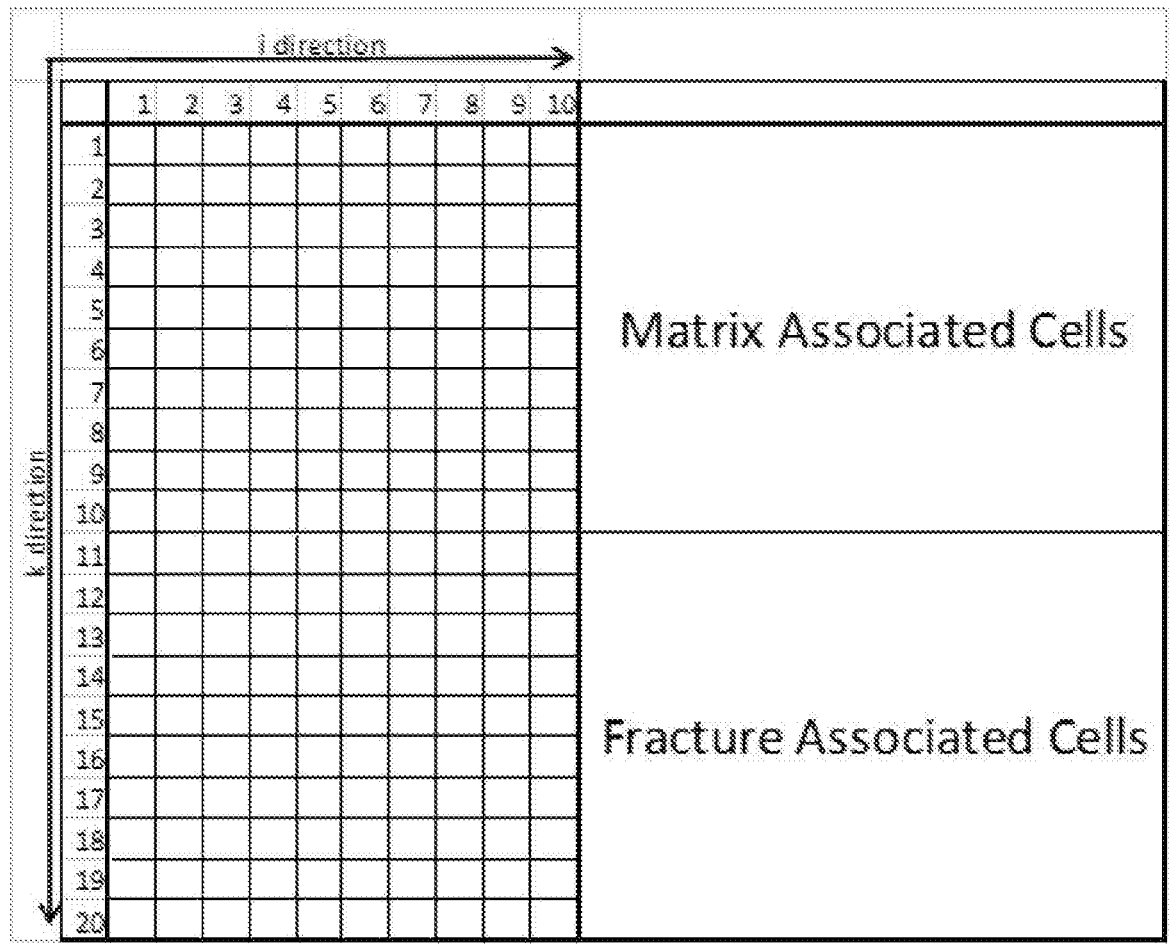
FIG. 4 is an example depiction of an example three-dimensional double porosity (double permeability) model grid layout.

In double porosity or double permeability models, a simulation grid may be presented with two identical grids stacked on each other. One grid may represent matrix porosity and the second grid may represent fractured porosity. An example double porosity grid layout is shown in FIG. 4.

During an example CRI process, hydraulic fractures may be created downhole via injection above the fracture gradient into selected and engineered injection formations. The fracture geometry may be imported into a three-dimensional (3D) flow simulator. The fracture shape representation in the model may create connections and filtration paths between the layers which naturally are not connected and to represent the actual filtration area in the flow model. A fracture in the model may be a high conductivity channel that acts as a path for fluid distribution from the well to formations.

In a 3D flow model, injection pressures and fluid distribution may be controlled by transmissibility values between cells. In some examples, fracturing may not be modeled in the 3D flow simulator, and the fracture shape may remain constant throughout the simulation.

Figure 5:
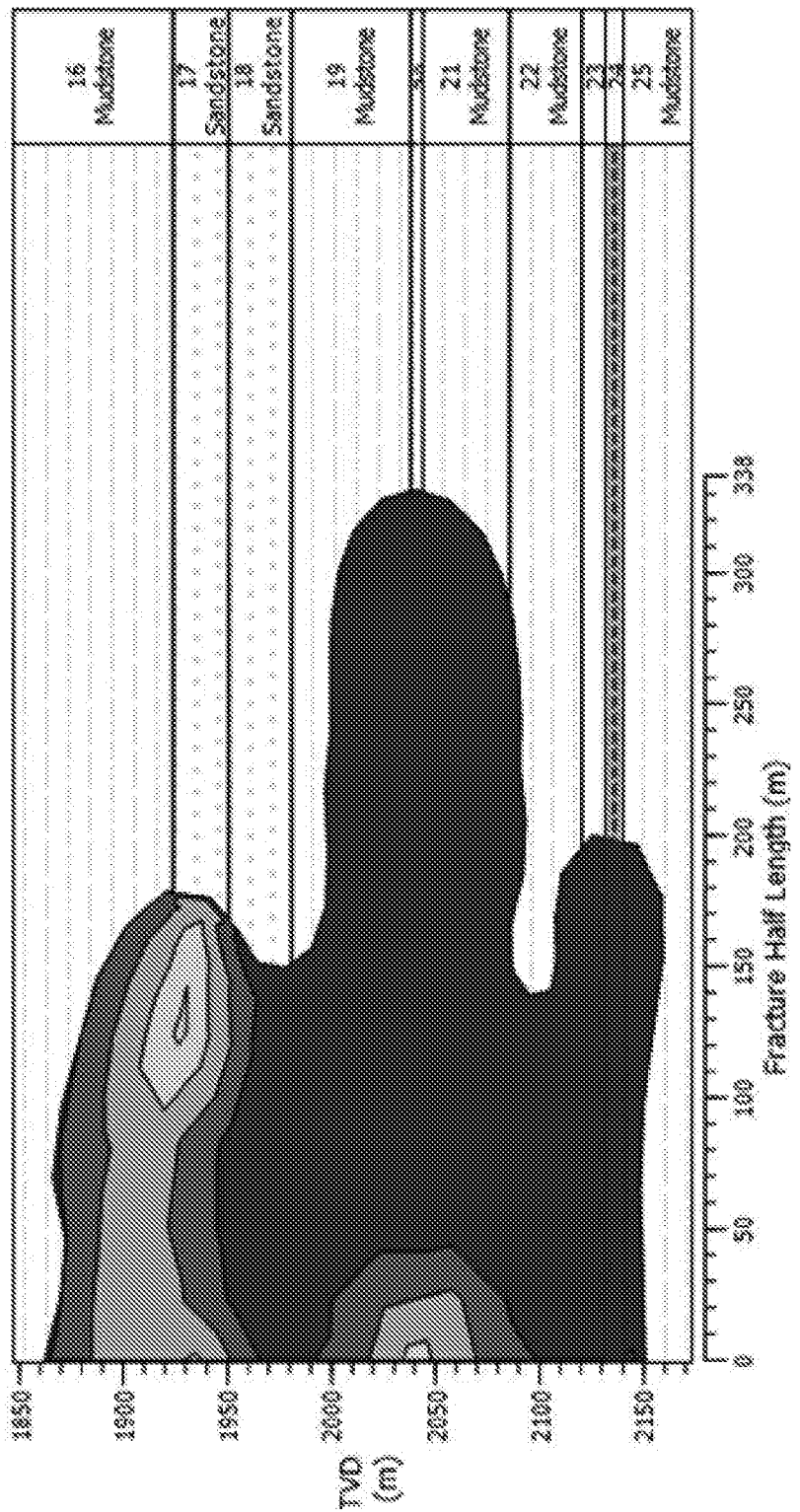
FIG. 5 is an example depiction of an example simulated vertical fracture geometry.

Hydraulic fracture geometry may be generated as a result of a hydraulic fracturing process simulation using a hydraulic fracturing simulator. Fracture geometry represents the size of the fracture body and relative position to the injection well, perforation interval of the injection well and surrounding formations (see, e.g., FIG. 5). According to the nature of conventional fracturing processes, induced hydraulic fracture is perpendicular to the minimum stress direction. The stress condition of the area may be defined by acting of the three principal stresses and the values of these stresses. In the generalized approach, there are two principal horizontal stresses, called minimum horizontal and maximum horizontal stress and one vertical stress also called overburden stress. Principal stresses are perpendicular to each other. The minimum stress is the stress which has absolute minimum value from all three principal stresses. It can be either one of horizontal stresses or vertical (overburden) stress. If minimum stress relates to one of the horizontal stresses, the vertical fracture is created. If minimum stress relates to vertical (overburden) stress, the horizontal fracture is propagated in the subsurface.

The geometry of a vertical fracture may be described as a value of upwards and downwards growth away from the perforation interval and a value of lateral extension in a direction away from the injection well. In some examples, a hydraulic fracturing simulator may export the fracture geometry in a file (e.g., a text file) having three columns related to fracture point coordinates which can be named X, Y, and Z.

The Z-coordinates may represent the fracture growth above and below the perforation interval and may show a distance between the point and an imaginary horizontal line (Y-axis) drawn through the middle of the perforation interval. Positive Z values may relate to points located above the Y-axis and negative Z values may relate to points located below the Y-axis.

The Y-coordinates may represent a distance between a point and imaginary vertical line (Z-axis) intersecting the Y-axis at zero. The hydraulic fracturing simulator may export coordinates for one wing of the hydraulic fracture, and Y-coordinates from the simulator may always be positive.

The X-coordinates may represent the fracture width. The X-axis may be an imaginary horizontal line normal to the Y-axis. Coordinates of a second fracture wing may be obtained by copying X and Z coordinates and negating the correspondent Y coordinate. Coordinate system origin may be related to the intersection between the horizontal plane going through the middle of perforation interval and the axis of the injection well.

In the event that the hydraulic fracturing simulator cannot simulate the horizontal fracture case, another process may be implemented. To simulate the case of horizontal fracture, a stress value in the hydraulic fracturing model may be set equal to the vertical (overburden) stress, a stress gradient may be set equal to zero, and an injection zone may be set wider than the expected fracture growth. Under these conditions, a generated fracture profile may be close to radial with equal fracture growth above and below the perforation interval and total fracture high equal to fracture half length. The Z and Y coordinates in case of horizontal fracture may represent the areal fracture distribution. The X coordinate may represent a fracture width like in the case of a vertical fracture.

In some example flow simulators, a fracture position may correspond to the 3D geometry of the field and position of the injection well and the middle of the perforation interval in the model. The position of the well in the 3D model may be controlled by the coordinates of the wellhead and the well trajectory. The well trajectory may be characterized as a line going through a number of points, each of which has specific coordinates in a 3D coordinate system, where two coordinates specify the areal position of the point and one coordinate specifies the depth of the point in relation to the mean sea level.

The coordinates of the fracture from the hydraulic fracture simulator may be modified according to the coordinates of the middle of the well perforation interval in the 3D model and the direction of the minimum stress.

For vertical fractures, the coordinates are transformed based on the following equations:

$$X_{f3D}=X_f\cos(F_a)Y_f\sin(F_a)+X_0 \quad (1)$$

$$Y_{f3D}=X_f\sin(F_a)+Y_f\cos(F_a)+Y_0 \quad (2)$$

$$Z_{f3D}=Z_0Z_f \quad (3)$$

where:
- $X_f$ is x-coordinate of the fracture point from the hydraulic fracturing simulator;
- $Y_f$ is y-coordinate of the fracture point from the hydraulic fracturing simulator;
- $Z_f$ is z-coordinate of fracture point from the hydraulic fracturing simulator;
- $X_0$ is x-coordinate of the middle of injection well perforation interval in the flow simulation model coordinate system;
- $Y_0$ is y-coordinate of the middle of injection well perforation interval in the flow simulation model coordinate system;
- $Z_0$ is z-coordinate (true vertical sub-sea depth) of the middle of injection well perforation interval; and
- $F_a$ is fracture geographic azimuth.

For horizontal fractures, the coordinates for the hydrodynamic flow simulation model may be obtained using two methods. In the first method, the coordinates may be estimated using the output coordinates from the hydraulic fracturing simulator. In this case, horizontal fracture coordinates for the flow simulator may be calculated using the formulas:

$$X_{f3D}=Z_f+X_0 \quad (4)$$

$$Y_{f3D}=Y_f+Y_0 \quad (5)$$

$$Z_{f3D}=Z_0X_f \quad (6)$$

In the second method, the coordinates of the horizontal fracture may be estimated mathematically using the circus equation and the calculated fracture radius. In such a case, the fracture is assumed to be ideally circular. The fracture radius may be calculated based on the hydraulic fracturing simulation results. The fracture from hydraulic fracturing simulator may be assumed to be an ellipsoid. The area of this ellipsoid may be estimated as follows:

$$S_e = \pi\frac{(Z_{fap}+|Z_{fbp}|)}{2}Y_{fm} \quad (7)$$

where:
- $Z_{fap}$ is maximum final fracture growth above the middle of injection interval;
- $Z_{fbp}$ is maximum final fracture growth below the middle of injection interval; and
- $Y_{fm}$ is maximum final fracture half-length.

The radius of the fully circular fracture with the area equal to area of the elliptical fracture may be estimated using the following equation:

$$R_f = \sqrt{\frac{S_e}{\pi}} \quad (8)$$

The horizontal fracture coordinates for the flow simulator may be estimated using the formulas:

$$X_{f3D}=R_f(\sin a)+X_0 \quad (9)$$

$$Y_{f3D}=R_f(\cos a)+Y_0 \quad (10)$$

$$Z_{f3D}=Z_0Z_w \quad (11)$$

where:
- a is circular fracture point azimuth (from 0 to 359°), and
- $Z_w$ is fracture width which is assumed to be uniform within the horizontal fracture. The average value of $Z_w$ may be estimated using the final fracture volume from the hydraulic fracturing simulator and fracture area ($S_e$).

In some example flow simulators, a hydraulic fracture may be represented by upscaling the fracture properties (i.e., porosity and permeability) in the grid cells being intersected by the fracture. The intersection may be identified by comparing the coordinates of the points located within the fracture shape with the coordinates of the simulation model grid cells. The process of properties change in cells related to fractured domain is called upscaling herein.

Figure 6:
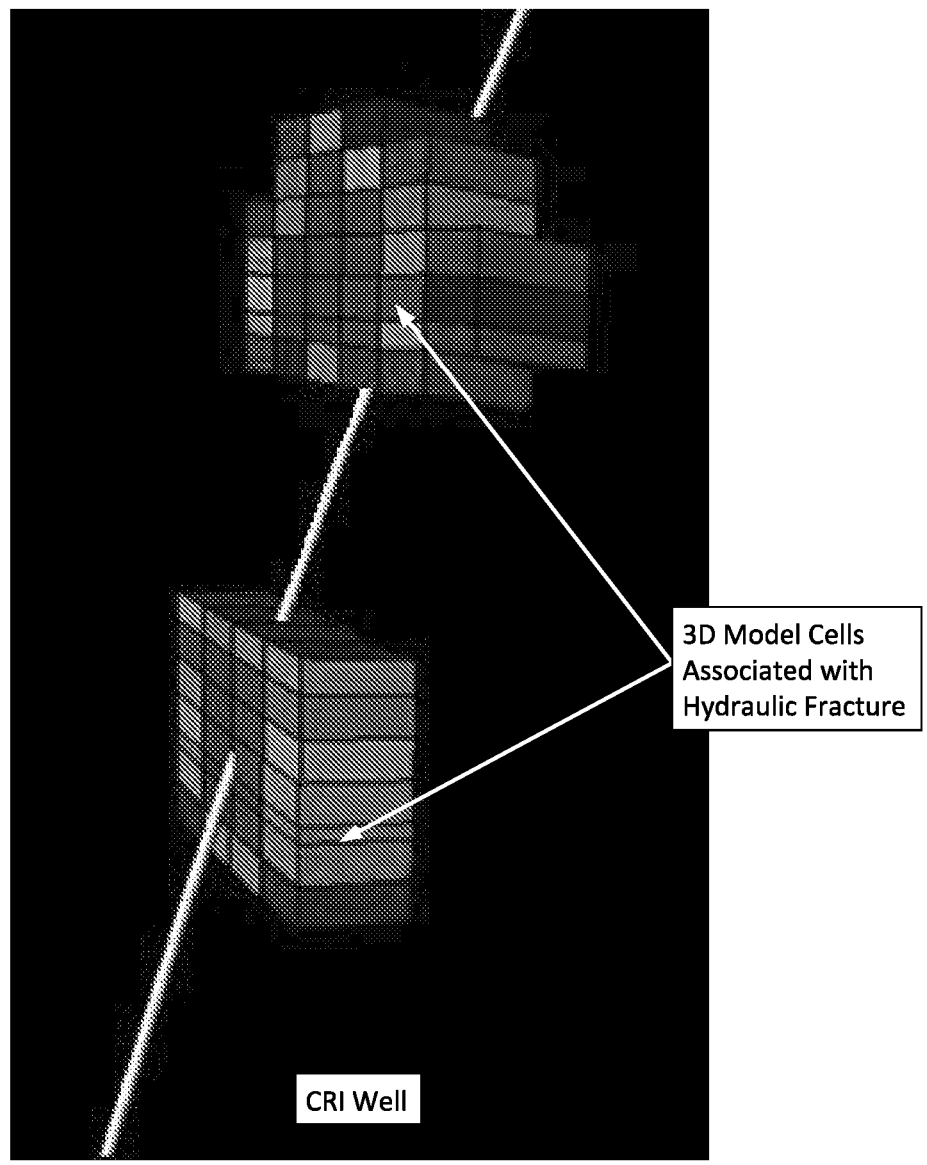
FIG. 6 is an example depiction of porosity upscaling from fracture to model cells for vertical fractures.
Figure 6:
Figure 7:
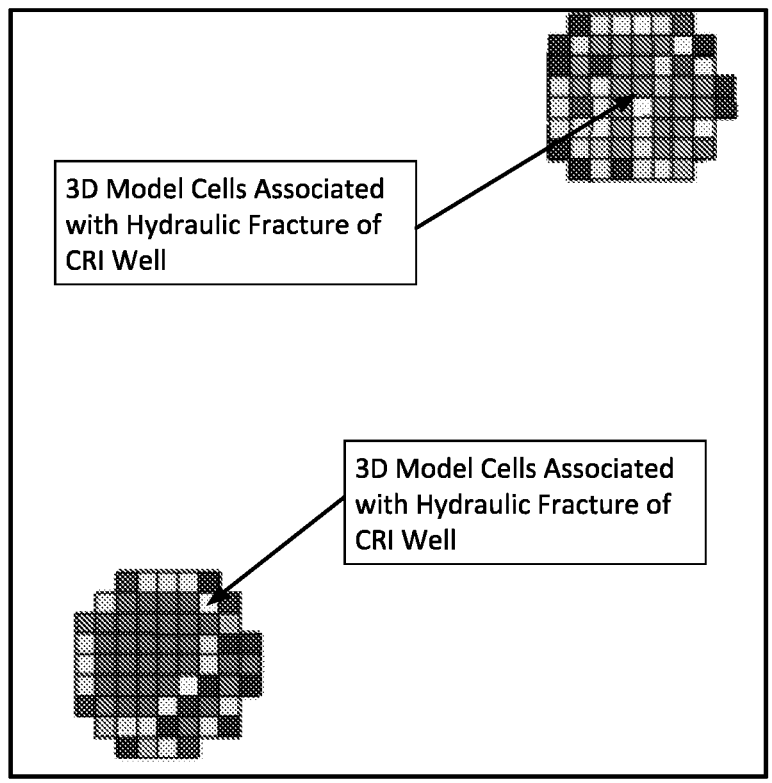
FIG. 7 is an example depiction of porosity upscaling from fracture to model cells for horizontal fractures.
Figure 7:

In double porosity (or double permeability) models, cells representing the fractured portion of the simulation model may have zero initial porosity and zero initial permeability. These cell properties may be estimated as a result of upscaling from the intersecting fracture. The porosity and permeability of cells not representing fractured domain (e.g., not intersected by the fracture) may remain equal to zero in double porosity systems. Examples of porosity upscaling to fracture associated cells is shown on FIGS. 6 and 7.

The porosity of the opening inside the fracture may be assumed to be equal to 1 as it is assumed that no rock grains are presented within the fracture body. The porosity of the grid cell intersected by the fracture may be updated based on the additional open space volume applied to the cell.

Permeability of the fracture may be estimated using the formula:

$$K_f = \frac{10^{12}\omega^2}{12} \quad (12)$$

where:
- $K_f$ is fracture permeability, Darcie; and
- $\omega$ is fracture width, meters.

Each grid cell of the hydrodynamic model may have several values of permeability. The value of permeability may vary depending on the direction and formation anisotropy. The final permeability of the grid cell penetrated by the fracture may depend on the permeability of the fracture in this cell (fracture width) and the relative direction of the fracture to the X, Y and Z axis of the model. To determine the result cell permeability, full tensor upscaling may be used. In a case of vertical fracture, which is parallel to the Y and Z axis, the intersected cell may have lower permeability in the X-direction (i.e., perpendicular to the fracture plane) and higher values in the Z- and Y-directions (i.e., parallel to the fracture plane). A cell penetrated by a horizontal fracture may higher permeability in the X- and Y-directions and lower permeability in the Z-direction.

An injection program or injection history of a CRI well generally includes injection of several basic types of fluids—cuttings slurry, viscous pill, sea water, water based mud, brine, oil-based mud, oil drains and others. A black oil simulator may allow operation with three types of liquid fluids—oil, water, and polymer. For simulation purposes, fluids from the injection program or history may be divided into three groups according to the main properties. Water-based fluids containing viscosifier (e.g., water based cuttings slurry, water based mud and viscous pill) may be simulated as polymer. Sea water, brine, overflush waster and other water-based fluids without viscosifier may be simulated as water. Oil-based mud, oil drains, oil based cuttings slurry may be simulated as oil.

One reason for the fluids assignment to different groups may be the effect of formation transmissibility change in the porous space in presence of fluids with high viscosity or simultaneous filtration of non-mixing fluids. The effect of formation transmissibility on fluid flow may be illustrated by Darcy's equation for linear flow:

$$q = \frac{KA}{\mu}\frac{P}{L} \tag{13}$$

where:
q is fluid flow in subsurface formation under the differential pressure P over distance L;
K is formation permeability;
A is area of filtration; and
μ is fluid viscosity.

The formation transmissibility may be the ratio of formation permeability over the fluid viscosity:

$$T = \frac{K}{\mu} \tag{14}$$

Generally, transmissibility is the formation's ability to transfer liquid. Transmissibility decreases with the decrease of permeability and with the increase of fluid viscosity. Fluid viscosified by polymer may have higher viscosity compared to water, and thus may have lower ability for propagation through the porous space under the same formation permeability, area of filtration, and differential pressure.

The concept of relative permeability accounts the changing of permeability of one of the non-mixing phases in relation to the phase saturation. Non-mixing fluids may be the oil-based and water-based liquids. The relative permeability of oil ($K_{ro}$) and water ($K_{rw}$) phases may be expressed as follows:

$$K_{rw} = \frac{K_{ew}}{K} \tag{15}$$

$$K_{ro} = \frac{K_{eo}}{K} \tag{16}$$

where:
$K_{ew}$ is effective permeability of water phase;
$K_{eo}$ is effective permeability of oil phase; and
K is absolute permeability.

The effective permeability of oil and water phases may be illustrated by Darcy's law:

$$q_o = \frac{K_{eo}A}{\mu_o}\frac{\partial P_o}{\partial x} \tag{17}$$

$$q_w = \frac{K_{ew}A}{\mu_w}\frac{\partial P_w}{\partial x} \tag{18}$$

Figure 8:
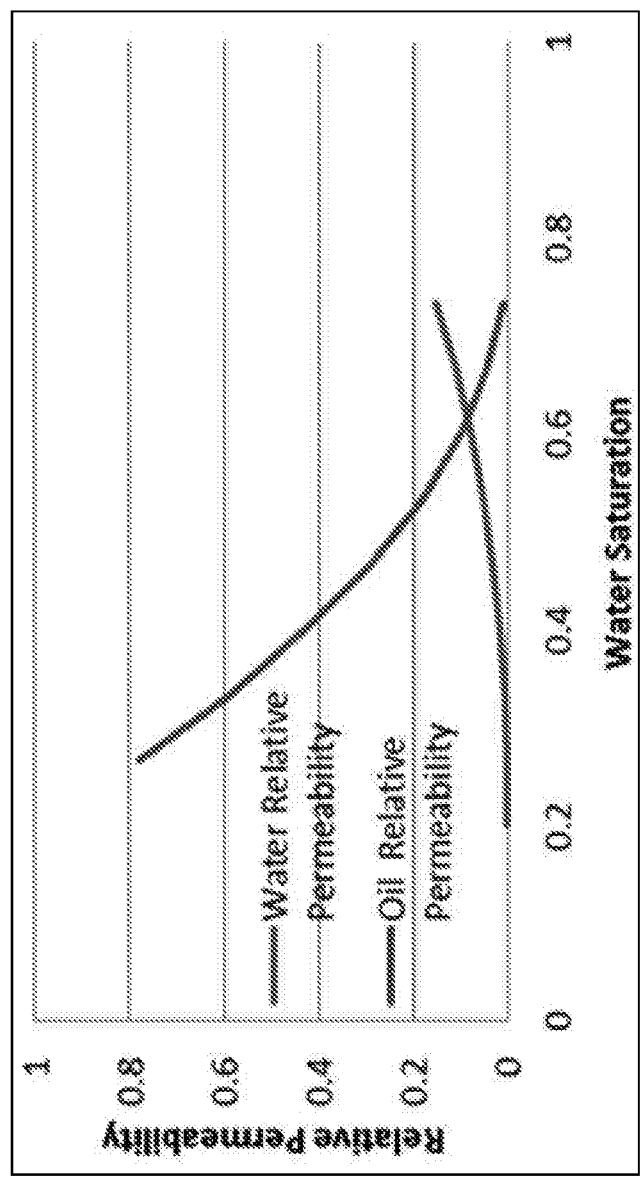
FIG. 8 is an example chart of saturation functions for cells representing matrix cells in an example three-dimensional flow model.

Oil-water saturation functions may represent the value of oil and water relative permeability versus water saturation. A general view of functions for porous rocks is shown in FIG. 8. Permeable formations selected as injected zones or intersected by hydraulic fracture may be water-saturated. These formations initially may have an absolute or a single phase value of permeability. As soon as another type of fluid which is not mixing with the initial fluid (e.g., water) is started being injected, saturation of the initial fluid decreases and causes the decrease of the initial fluid's effective permeability value.

Saturation functions may be obtained in a laboratory as a result of core sample testing. Core samples may be obtained from the reservoir formation and may contain information about the rock nature and rock various properties. Core samples may also be a source of material representing the rock behavior with respect to fluid displacement and reaction to different fluid types.

Figure 9:
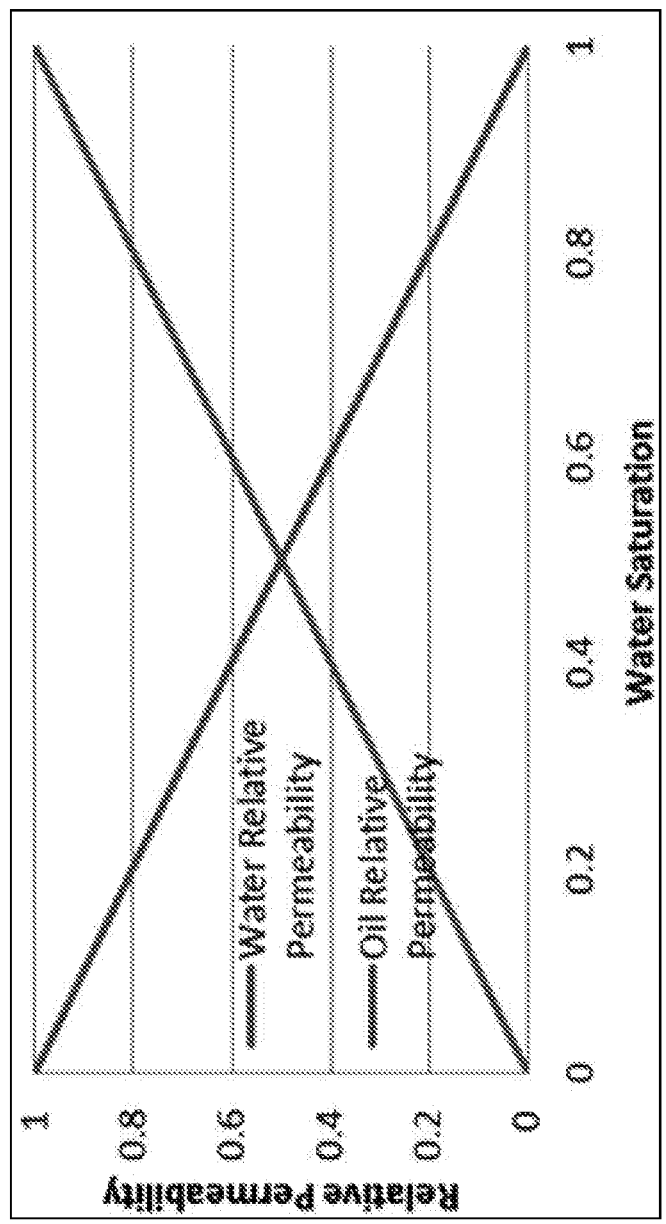
FIG. 9 is an example chart of saturation functions for cells representing fracture cells in an example three-dimensional flow model.

If saturation functions are not available for a studied formation as a result of laboratory experiments, these functions may be estimated using Corey correlations or obtained from literature for formations which have comparable properties. For fractures, saturation functions are set as straight lines due to an absence of capillary forces, such as shown on FIG. 9.

To simplify injection well definition in the flow simulator, several wells may be defined and completed in the same model cells representing the fractured domain according to the perforation and connection data from the simulated injection well. Each well may simulate the injection of single type of waste. For example, one well may be dedicated for oil-based waste injection. This well may be defined as an oil injector in the model. Another well may be defined as a dedicated well for viscosified fluid injection. This well may be defined as a polymer injector in the model. Another well may be defined as a dedicated well for non-viscosified water-based waste injection. This well may be defined as a water injector. All wells may be controlled separately according to the simulated fluid injection schedule. This injection schedule may include historical injection data or future prognosed data.

If the permeable formations (e.g., formations that have interconnected pore space) are presented in the model and are intersected by any means by a hydraulic fracture body, these formations may be subjected as the main pressure transducers in the flow model and the main fluid accumulation zones. Non-permeable formations may accumulate some amount of liquid only within the cells representing the fractured domain. A pressure increase in not permeable formations may also be associated with cells representing the fractured domain.

As a result of fluid injection during the CRI, formation pressure may be increased compared to the initial value prior the injection. The value of formation pressure increase may be measured by comparing the initial pressure value in a model cell with the pressure value in the cell at the end or at any stage of simulation of fluid injection into formation via CRI injection well. The area of increased pressure in the simulation model may be represented with simulation model cells having a higher level of pressure compared to initial formation pressure at zero timestep of simulation. The level of pressure increase that the single cell should have to be associated with the increased pressure area may be defined by the user performing the simulation.

The penetration of different types of injected waste through the formations may be different depending on the fluid and rock properties. To evaluate the fluid waste distribution profile around the CRI injection well in subsurface formations, the contours of fluid propagation for different types of fluids may be estimated independently according to the procedure described herein below.

Figure 10:
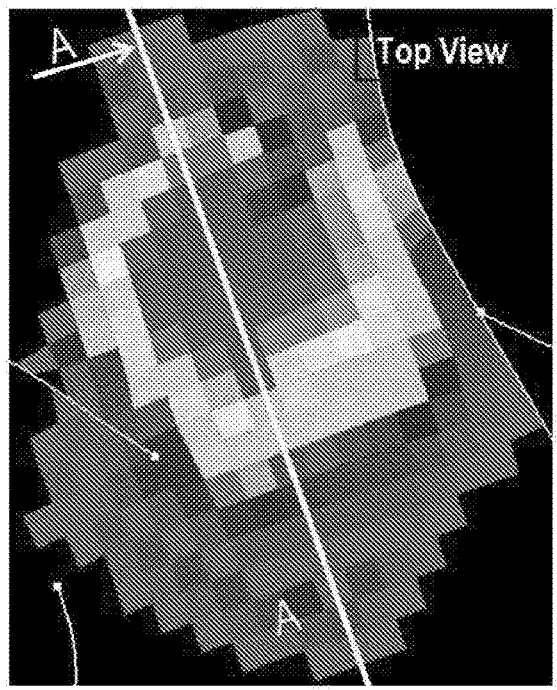
FIG. 10 is an example depiction of an oil-based waste distribution as oil saturation changes in permeable formation.
Figure 10:
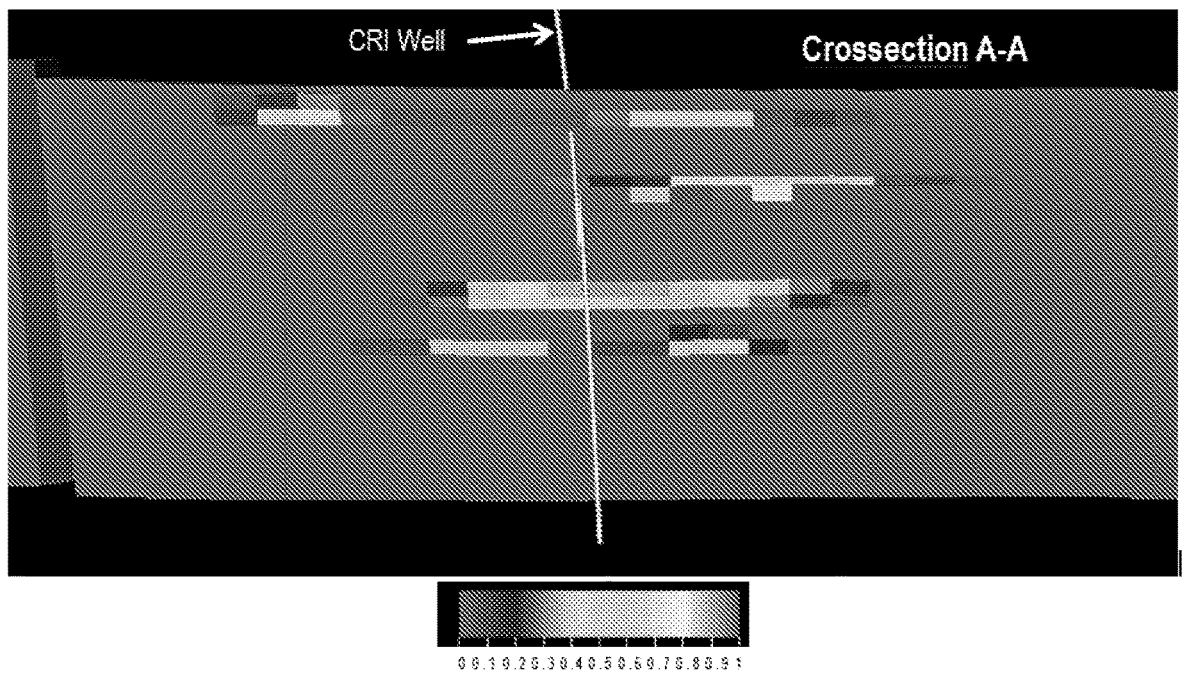

The level of penetration of oil contaminated waste (e.g., oil drains, oil based mud, oil based slurry and others containing oil) through the permeable formations may be demonstrated as changing of oil saturation in simulation model cells, as shown in FIG. 10. The value of oil saturation increase may be measured by comparing the initial oil saturation value in the model cell with the oil saturation value in the cell at the end or at the any stage of simulation of fluid injection into formation via CRI injection well. The area of increased oil saturation in simulation model may be represented with simulation model cells having higher level of oil saturation when compared to initial oil saturation at zero timestep of simulation. The level of oil saturation that the single cell should have to be associated with the oil contaminated waste propagation area may be to be defined by the user performing the simulation.

Reservoir formations of the flow model may be initially water saturated according to the definition of the formations suitable for CRI. Generally, these formations normally do not contain movable hydrocarbons (e.g., oil or gas) or the amount of the movable hydrocarbons is relatively low, thus making it difficult, imprecise, and/or or impossible to directly inspect the non-viscosified water based waste propagation using the water saturation values of the simulation model cells. To make water based waste "visible" in the flow simulation model, the well defined in the model as a water injector may also be defined as a tracer injector. A tracer option may be enabled in the flow simulator. All required definitions for tracer injection simulation may be predetermined in the model according to the simulator user manual or according to any type of simulator operational procedures, description, or guidance.

The level of penetration of non-viscosified water-based waste (e.g., sea water, injection well overflush liquids, and others not containing oil or polymer) through the permeable formations may be demonstrated as changing the tracer concentration value in simulation model cells. The value of tracer concentration increase may be measured by comparing the initial tracer concentration value in the model cell with the tracer concentration value in the cell at the end or at the any stage of simulation of fluid injection into formation via CRI injection well. The area of increased tracer concentration in simulation model may be represented with simulation model cells having the higher level of tracer concentration compared to the initial tracer concentration at zero timestep of simulation. The level of tracer concentration that the single cell should have to be associated with the water based waste propagation area may be to be defined by the user performing the simulation.

To simulate the injection of viscosified waste in the flow simulation model, the well defined in the model as an injector may also be defined as a polymer injector. The polymer option may be enabled in the flow simulator. All required definitions for polymer injection simulation may be predetermined in the model according to the simulator user manual or according to any type of simulator operational procedures, description, or guidance.

The level of penetration of viscosified waste (e.g., cuttings slurry, viscous pills and others which composition presumes containing the viscosifier (polymer)) through the permeable formations may be demonstrated as changing the polymer concentration value in simulation model cells. The value of polymer concentration increase may be measured by comparing the initial polymer concentration value in the model cell with the polymer concentration value in the cell at the end or at the any stage of simulation of fluid injection into formation via CRI injection well. The area of increased polymer concentration in simulation model may be represented with simulation model cells having a higher level of polymer concentration compared to the initial polymer concentration at zero timestep of simulation. The level of polymer concentration that the single cell should have to be associated with the viscosified waste propagation area may be to be defined by the user performing the simulation.

A not permeable (or non-permeable or impermeable) formation is a formation that does not contain interconnected pore space. Not permeable formations cannot provide the required path(s) for fluid migration through this formation and the pore space required for fluid accumulation. If the fracture body in the model penetrates only through not permeable formation(s), another process may be implemented, as described herein.

If a fractured domain is not connected with the permeable formation, fluid filtration and accumulation may occur only within the fractured area of the target formation. In the CRI flow simulation model, the fractured domain may be associated with cells penetrated by the simulated hydraulic fracture. These cells may be defined according to the procedures previously described herein.

Large scale industry experiments (e.g., Mounds experiments) show that the injection of the drill waste is generally accompanied by the creation of the fracture network in the subsurface formation. The fracture network may include a main fracture originating from the wellbore and a large number of secondary fractures originating from the main fracture. If any permeable formation is intersected by the fractured domain, and thus is involved in the injection process, the fracture network will generally be filled with the injected solid phase while the liquid will leak-off into the intersected by the fracture permeable rocks. If no permeable formation is involved in CRI process, the fracture network will generally contain both liquid and solids.

In some example flow models, cells that represent not permeable formation and located outside the fractured domain area may have zero permeability value. Cells that represent the fractured domain may have porosity and permeability values according to the results of the upscaling process, as previously described herein. To model the creation of a secondary fractures network during the injection, the initial porosity (with initial value most likely close to zero) of the cells representing the fractured domain in the model may be increasing with the increasing of the volume of injected waste. A porosity increase may be related only to the cells representing the fractured domain. In the rest of cells of the model, the porosity may equal the initial value throughout the simulation.

Figure 11:
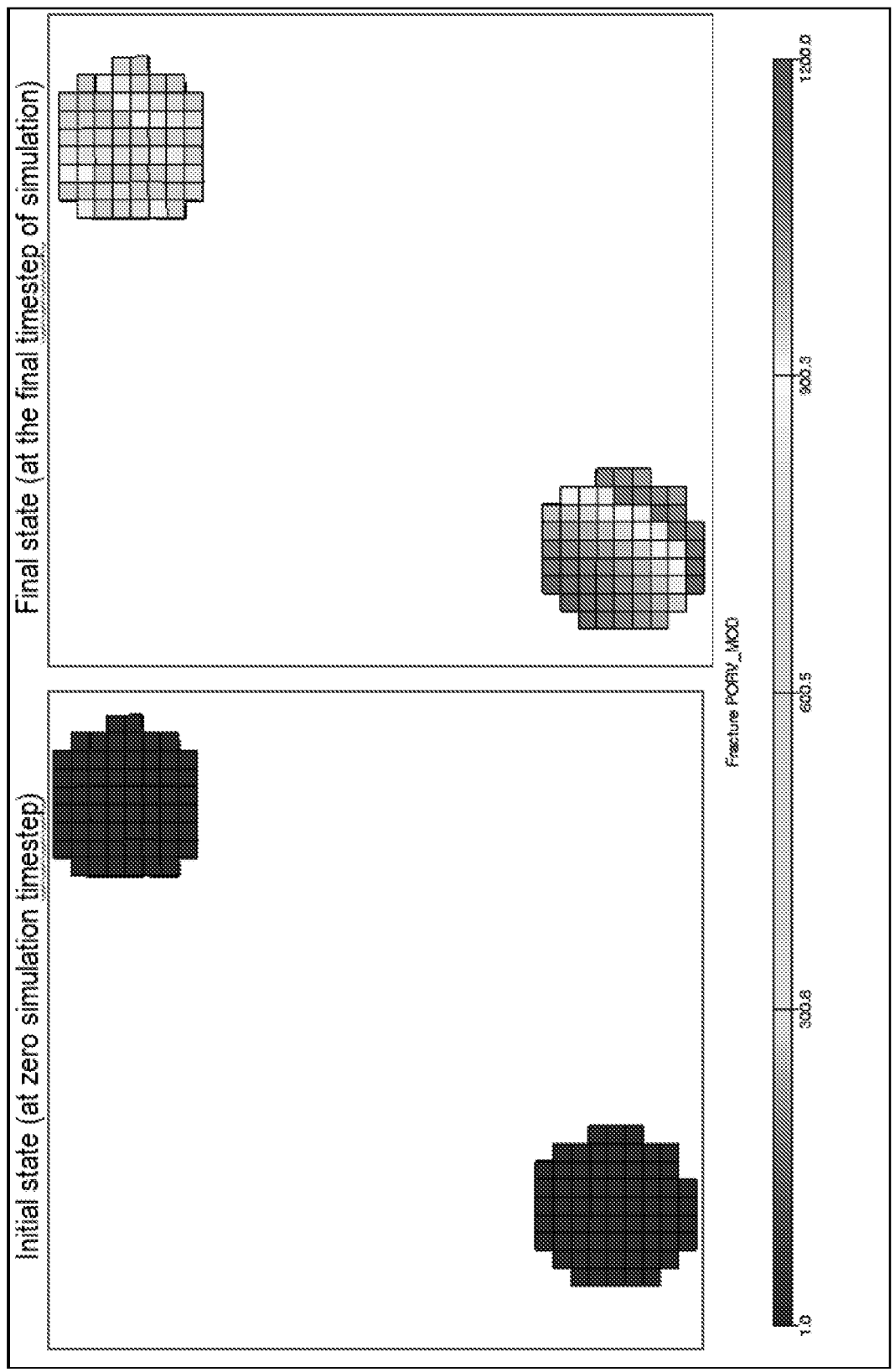
FIG. 11 is an example depiction of pore volume change in not-permeable formation.

If the flow simulator can provide simulation of rock pore volume and transmissibility modification with the pressure, this option may be used to simulate the pore volume and transmissibility increase of the fracture related cells (e.g., rock compressibility data). The pore volume and transmissibility may be input parameters in flow simulator as functions of pressure. In the rock compressibility data, the greater pore volume of the cell and greater value of cell transmissibility corresponds to the greater value of pressure. With the start of simulation of the CRI flow process, pressure value may increase in cells that accumulate injected fluid. With the increased pressure value, pore volume of cell and cell transmissibility increases according to law defined in provided functions of rock pore volume and transmissibility modification. An example of simulated pore volume change is shown in FIG. 11.

Rock compressibility functions may be based on the experience of CRI in the simulated field, or may be based on the experience of CRI into the formation which properties can be applicable to the simulation model. The applicability of other formation properties to the simulation model may be checked and realized by the user performing the simulation.

An increased formation pressure area and fluid distribution profile in the flow model simulating the injected fluid accumulation and distribution only within not permeable formation may be related only to cells representing fracture domains, and thus do not require additional identification procedures. However, to estimate the distribution of different types of liquid (e.g., water, oil-based, viscosified) within the cells representing fractured domains, this may be accomplished according to the procedure described for the case of permeable rocks.

Figure 12:
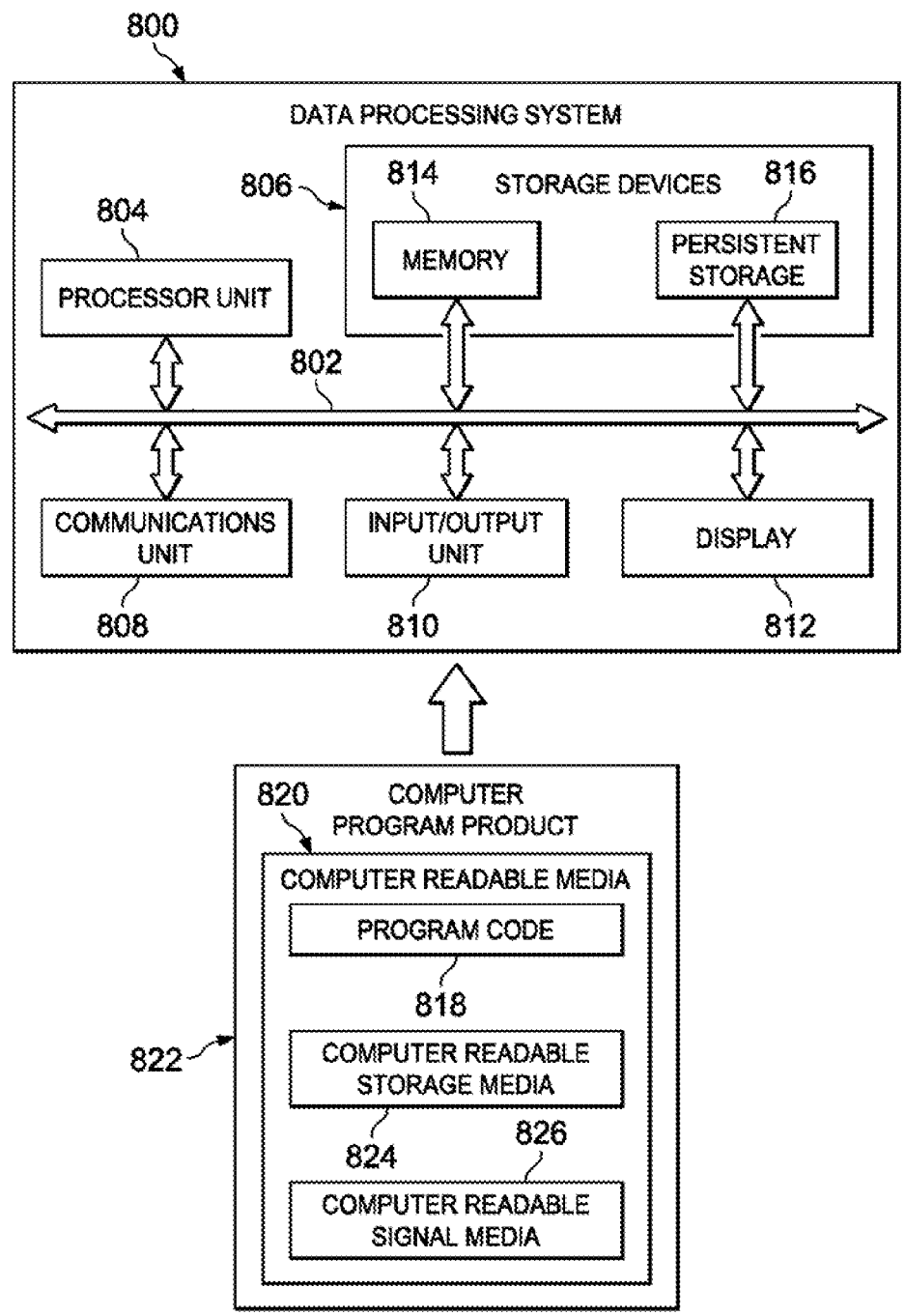
FIG. 12 is an example computing system for determining a waste distribution and formation pressure profile; all arranged in accordance with at least some of the embodiments disclosed in the present disclosure.

Turning now to FIG. 12, an illustration of a system is depicted in the form of a block diagram in accordance with an illustrative embodiment. Data processing system 800 may be used to implement example simulators, systems, and/or methods described herein. As depicted, data processing system 800 includes communications framework 802, which provides communications between processor unit 804, storage devices 806, communications unit 808, input/output unit 810, and display 812. In some cases, communications framework 802 may be implemented as a bus system.

Processor unit 804 is configured to execute instructions for software to perform a number of operations. Processor unit 804 may comprise at least one of a number of processors, a multi-processor core, or some other type of processor, depending on the implementation. In some cases, processor unit 804 may take the form of a hardware unit, such as a circuit system, an application specific integrated circuit (ASIC), a programmable logic device, or some other suitable type of hardware unit.

Instructions for the operating system, applications and programs run by processor unit 804 may be located in storage devices 806. Storage devices 806 may be in communication with processor unit 804 through communications framework 802. As used herein, a storage device, also referred to as a computer readable storage device, is any piece of hardware capable of storing information on a temporary basis, a permanent basis, or both. This information may include, but is not limited to, data, program code, other information, or some combination thereof.

Memory 814 and persistent storage 816 are examples of storage devices 806. Memory 814 may take the form of, for example, a random access memory or some type of volatile or non-volatile storage device. Persistent storage 816 may comprise any number of components or devices. For example, persistent storage 816 may comprise a hard drive, a flash memory, a rewritable optical disk, a rewritable magnetic tape, or some combination of the above. The media used by persistent storage 816 may or may not be removable.

Communications unit 808 allows data processing system 800 to communicate with other data processing systems, devices, or both. Communications unit 808 may provide communications using physical communications links, wireless communications links, or both.

Input/output unit 810 allows input to be received from and output to be sent to other devices connected to data processing system 800. For example, input/output unit 810 may allow user input to be received through a keyboard, a mouse, some other type of input device, or a combination thereof. As another example, input/output unit 810 may allow output to be sent to a printer connected to data processing system 800.

Display 812 is configured to display information to a user. Display 812 may comprise, for example, without limitation, a monitor, a touch screen, a laser display, a holographic display, a virtual display device, some other type of display device, or a combination thereof.

In this illustrative example, the processes of the different illustrative embodiments may be performed by processor unit 804 using computer-implemented instructions. These instructions may be referred to as program code, computer usable program code, or computer readable program code and may be read and executed by one or more processors in processor unit 804.

In these examples, program code 818 is located in a functional form on computer readable media 820, which is selectively removable, and may be loaded onto or transferred to data processing system 800 for execution by processor unit 804. Program code 818 and computer readable media 820 together form computer program product 822. In this illustrative example, computer readable media 820 may be computer readable storage media 824 or computer readable signal media 826.

Computer readable storage media 824 is a physical or tangible storage device used to store program code 818 rather than a medium that propagates or transmits program code 818. Computer readable storage media 824 may be, for example, without limitation, an optical or magnetic disk or a persistent storage device that is connected to data processing system 800.

Alternatively, program code 818 may be transferred to data processing system 800 using computer readable signal media 826. Computer readable signal media 826 may be, for example, a propagated data signal containing program code 818. This data signal may be an electromagnetic signal, an optical signal, or some other type of signal that can be transmitted over physical communications links, wireless communications links, or both.

The illustration of data processing system 800 in FIG. 12 is not meant to provide architectural limitations to the manner in which the illustrative embodiments may be implemented. The different illustrative embodiments may be implemented in a data processing system that includes components in addition to or in place of those illustrated for data processing system 800. Further, components shown in FIG. 12 may be varied from the illustrative examples shown.

While various aspects and embodiments have been disclosed herein, other aspects and embodiments will be apparent to those skilled in the art. The various aspects and embodiments disclosed herein are for purposes of illustration and are not intended to be limiting.

What is claimed is:

1. A method of simulating subsurface formations, the method comprising:
   modeling a subsurface formation to generate a hydrodynamic flow model based at least on a geometry and a physical property of a subsurface formation;
   generating a fracture profile representing a geometry of a fracture extending from an injection well formed in the subsurface formation, the geometry including a volume and a position of the fracture relative to the injection well, and the fracture generated by a waste material injected into the injection well; and
   generating a simulated model of the subsurface formation, the simulated model including a visual depiction of the subsurface formation based at least on the fracture profile and the hydrodynamic flow model, the visual depiction including a plurality of cells in at least two dimensions, each of the plurality of cells representing at least one property of a location within the subsurface formation.

2. The method of claim 1, wherein the hydrodynamic flow model comprises a three-dimensional grid representing a structural map of the subsurface formation.

3. The method of claim 2, wherein the three-dimensional grid comprises a plurality of cells in horizontal and vertical dimensions, each cell representing a location in the subsurface formation, and each cell representing a geometry and a physical property of a subsurface formation at the respective location.

4. The method of claim 1, wherein the fracture profile comprises at least one of:
   a vertical component of the fracture representing the geometry of the fracture in a vertical direction of the subsurface formation; and
   a horizontal component of the fracture representing the geometry of the fracture in a horizontal direction of the subsurface formation in at least one depth level of the subsurface formation.

5. The method of claim 1, further comprising modifying the fracture profile based on at least one of a porosity of the fracture and a permeability of the fracture.

6. The method of claim 5, wherein modifying the fracture profile comprises scaling at least one of the porosity of the fracture and permeability of the fracture in a set of cells of the plurality of cells that define the fracture.

7. The method of claim 1, wherein the at least property of the location within the subsurface formation includes at least one of a porosity, a permeability, a fluid saturation, and a pore pressure.

8. The method of claim 1, wherein the visual depiction including the plurality of cells in at least two dimensions comprises the plurality of cells in at least one horizontal direction and at least one vertical direction.

9. The method of claim 1, wherein the visual depiction includes the plurality of cells in three dimensions.

10. The method of claim 1, further comprising:
    comparing a first pressure value of a cell of the plurality of cells in the visual depiction at a first time and a second pressure value of the cell at a second time; and
    identifying an increase in pressure in the cell or a decrease in pressure in the cell between the first time and the second time based on the comparison of the first pressure value and the second pressure value.

11. The method of claim 1, wherein the visual depiction assigns a color to each cell of the plurality of cells based at least on a value associated with the at least one property of the respective location within the subsurface formation.

12. The method of claim 11, wherein the color varies based on a porosity value, a permeability value, a fluid saturation value, and a pore pressure value.

13. A system for simulating subsurface formations, the system comprising:
    a database having data representing a plurality of properties at locations in a subsurface formation;
    a simulator that models the subsurface formation based at least on the data, wherein the simulator:
      simulates a flow model representing a geometry and at least one physical property of the subsurface formation based at least on the data;
      generates a fracture profile of at least one fracture extending from an injection well formed in the subsurface formation based at least on the data, wherein the fracture profile represents at least a volume of the at least one fracture and a position of the at least one fracture relative to the injection well, and the at least one fracture is generated by a waste material injected into the injection well; and
      constructs a simulated model of the subsurface formation based at least on the flow model and the fracture profile, the simulated model representing a plurality of locations in the subsurface formation, and simulated model depicting the plurality of properties of the subsurface formation at the plurality of locations.

14. The system of claim 13, wherein the fracture profile further represents one dimension of the at least one fracture.

15. The system of claim 14, wherein the at least one dimension of the at least one fracture includes a horizontal dimension and a vertical dimension.

16. The system of claim 13, wherein the simulator constructs the simulated model of the subsurface formation for a plurality of time instances such that changes in the plurality of properties at locations within the subsurface formation are displayed in the simulated model.

17. The system of claim 13, wherein the data represents a plurality of properties at the locations in the subsurface formation at a first time and at a second time, the second time being after the waste material is injected into the injection well formed in the subsurface formation.

18. The system of claim 13,
    wherein the data includes porosity values of the subsurface formation and permeability values of the subsurface formation; and
    wherein the simulated model includes a porosity value of the at least one fracture and a permeability value of the at least one fracture for each of the locations in the subsurface formation.

19. The system of claim 13,
    wherein a porosity value for each of the locations in the subsurface formation is depicted at a first instance and at a second instance, the second instance being after the waste material is injected into the injection well formed in the subsurface formation; and
    wherein the simulated model indicates a change in the porosity value for each of the locations in the subsurface formation between the second instance and the first instance.

* * * * *